United States Patent [19]

Roberts et al.

[11] Patent Number: 5,433,975
[45] Date of Patent: Jul. 18, 1995

[54] DEPOSITION OF TUNGSTEN FILMS FROM MIXTURES OF TUNGSTEN HEXAFLUORIDE ORGANOHYDROSILANES AND HYDROGEN

[75] Inventors: David A. Roberts, Carlsbad, Calif.; Diwakar Garg, Macungie, Pa.; André Lagendijk, Oceanside; Arthur K. Hochberg, Solana Beach, both of Calif.; Stephen M. Fine, Far Hill, N.J.

[73] Assignee: Air Products and Chemicals, Inc., Allentown, Pa.

[21] Appl. No.: 116,178

[22] Filed: Sep. 2, 1993

Related U.S. Application Data

[62] Division of Ser. No. 616,288, Nov. 20, 1990, abandoned.

[51] Int. Cl.$^6$ .............................................. C23C 16/60
[52] U.S. Cl. ................................ 427/253; 427/255.2; 427/255.1; 427/294

[58] Field of Search ............... 427/253, 248.1, 255.1, 427/255.2, 294, 250

[56] References Cited

U.S. PATENT DOCUMENTS

| 4,741,928 | 5/1988 | Wilson et al. | 4278/253 |
| 4,751,101 | 6/1988 | Joshi | 427/253 |
| 4,918,033 | 4/1990 | Bartha et al. | 437/245 |
| 5,175,017 | 12/1992 | Kobayashi et al. | 427/253 |
| 5,230,847 | 7/1993 | Jalby et al. | 427/253 |

*Primary Examiner*—Janyce Bell
*Attorney, Agent, or Firm*—Geoffrey L. Chase; William F. Marsh

[57] ABSTRACT

A method of depositing tungsten films comprising heating a substrate to a temperature above 200° C. in a chemical vapor deposition reactor, flowing a stream of carrier gas over the substrate in the reactor, and simultaneously introducing mixtures of $WF_6$ and organohydrosilanes into the reactor.

17 Claims, No Drawings

DEPOSITION OF TUNGSTEN FILMS FROM MIXTURES OF TUNGSTEN HEXAFLUORIDE ORGANOHYDROSILANES AND HYDROGEN

This is a division of application Ser. No. 07/616,288, filed Nov. 20, 1990, now abandoned.

FIELD OF THE INVENTION

This invention relates to the manufacture of electronic devices and, specifically, to the deposition of tungsten films, with particular application to the manufacture of semiconductor devices, but not limited thereto.

BACKGROUND OF THE INVENTION

Since the creation of the first integrated circuit in 1960, there has been an ever increasing density of devices manufacturable on semiconductor substrates. Silicon technology has remained the dominant force in integrated circuit fabrication. Very large scale integration, or VLSI, devices having more than 100,000 devices per chip, have become foundational to computer technologies and many related technologies. The increasing device count has been accompanied by a shrinking (minimum) feature size, now diminished to less than 1 μm.

As the size of features shrink below 1 μm, and chip sizes increase beyond 1.0 cm², polycide sheet resistances of 1-5 ohms/sq become the limiting performance factor for VLSI circuits. In these cases it is necessary to use even lower resistance interconnects, possibly made of metal films (P. Burggraaf, "Silicide Technology Spotlight", Semi International., May '85, p. 293).

Several nonferrous and refractory metals such as Al, Ti, W, Mo, and Ta have been considered by the electronics industry as interconnect materials. The application of these metal interconnects has been extensively studied by researchers in the electronics industry. The selection and use of these materials in VLSI devices depends greatly upon their physical and chemical properties. For example, aluminum is widely used by the electronics industry for VLSI interconnects because of its high conductivity. However, aluminum suffers from an inability to withstand high temperature processing, which precludes its use in self-aligned MOS processing. This is not the case, with the refractory metals (i.e. Tungsten-W, Titanium-Ti, Molybdenum-Mo, and Tantalum-Ta). The applicability of these materials to VLSI interconnect applications has been considered (e.g. U.S. Pat. No. 4,629,635.) Extensive efforts have been directed towards developing chemical vapor deposition (CVD) of tungsten (W) thin films for low resistance interconnects in VLSI devices including self-aligned MOS devices.

By far the most widely employed precursor for depositing tungsten thin films by CVD is tungsten hexafluoride, (WF$_6$). Processes for depositing tungsten films by CVD fall into two broad categories: the first is designated selective (N. E. Miller and I. Beinglas, *Solid State Technology*, December '82, p.85.) and the second is designated blanket deposition (K. C. Saraswate, et.al., *IEEE Trans. on Elect. Dev.*, ED-30, No. 11, p. 1947, (1983)). The term "Selective" generally refers to the deposition of tungsten on silicon or metal substrates but not on silicon oxide or metal oxide substrates. The term blanket deposition generally refers to the deposition of tungsten on the entire surface of the substrate. Both types of depositions rely upon the reduction of WF$_6$ by a reducing agent typically hydrogen, silane, or silicon or a combination thereof. Whether the process is selective or not is determined by the reaction conditions of the deposition such as the temperature, pressure and nature of the reagents used during the tungsten deposition.

The chemistry involved in depositing tungsten by CVD using WF$_6$ has been extensively reviewed and discussed in several books including Refractory Metals for VLSI Applications, Editor R. S. Blewer, Material Research Society, 1986; ibid, Vol. II, Editor E. K. Broadbent, 1987; and ibid Vol. IV, Editors R. S. Blewer and C. M. McConica, 1989. The teachings of these books are incorporated in this disclosure by reference.

The invention of this disclosure relates to modifying the chemistry of the reduction of WF$_6$ for depositing thin W film on a substrate. The prior art for the reduction of WF$_6$ specifically on a silicon substrate to give tungsten films is summarized in equations 1-4 below:

$$2 \text{ WF}_6 + 3 \text{ Si}^\circ \rightarrow 2 \text{ W}^\circ + 3 \text{ SiF}_4 \qquad 1)$$

$$\text{WF}_6 + 3 \text{ H}_2 \rightarrow \text{W}^\circ + 6\text{HF} \qquad 2)$$

$$2 \text{ WF}_6 + 3 \text{ SiH}_4 \rightarrow 2 \text{ W}^\circ + 3 \text{ SiF}_4 + 6 \text{ H}_2 \qquad 3)$$

$$\text{WF}_6 + \text{Si}_N\text{H}_{4N-2} \rightarrow \text{W}^\circ + N(\text{SiF}_4) + (2N-1)\text{H}_2 \qquad 4)$$

Where N=1,2, or 3

Equation 1 relates to the reduction of WF$_6$ by a silicon substrate during the initial stage of W film deposition. The WF$_6$ is reduced to the tungsten metal and the silicon is oxidized to the volatile SiF$_4$. This can be a deleterious reaction which leads to erosion of the substrate, undercutting of masked areas, and deposition of porous films (e.g. E. K. Broadbent and C. L. Rumiller, *J. Electrochemical Society*, 131, No. 6, p. 1427, (1984) or the general references cited above). Other substrates such as aluminum metal also undergo a similar reaction with WF$_6$ to deposit tungsten. These are self limiting reactions in that only very thin films can be deposited. Therefore, it is not desirable to deposit tungsten films on metallic or silicon substrates by the reduction of WF$_6$ with the substrate when thicker films are required or substrate damage must be avoided.

Equation 2 represents the deposition of tungsten from WF$_6$ by the reduction with hydrogen and is the most widely used technique for selective and blanket depositions. In the selective process, the H$_2$ is activated for reduction of WF$_6$ by chemisorption onto a tungsten surface. In combination with the chemistry summarized in equation 1, this results in film formation only on areas which were initially Si°, and no deposition on SiO$_2$. The deposition temperature can range from 300° to 500° C. depending on the application. Selective deposition can also occur on other substrates which permit an initial tungsten metal deposition similar to that illustrated in equation 1.

Equations 3 and 4 represent a recent development in WF$_6$ reduction for depositing tungsten films. There are now many references describing the use of silane or polysilane to deposit tungsten film from WF$_6$. Several references are contained in the workshop proceedings on tungsten and other refractory metals for VLSI applications cited above. References from the literature include Park, H. L. et al *Thin Solid Films* 181, 35-93, 1989 and Rosler, R. S. et al *J. Vac. Sci. Technol.* 6(6) 1821-7, 1988 and from the patent art including U.S. Pat. Nos. 4,851,295 and 4,892,893. The teachings of these references are incorporated herein by reference. The reactions result in the deposition of W° and generation of a volatile $SiF_4$ from silane or polysilane thereby reducing silicon incorporation in the depositing film. Silane or polysilane reduction of $WF_6$ is generally carried out in the presence of $H_2$. Therefore, these deposition reactions are a combination of equations 1–3 or 1,2 and 4. Silane or polysilane additions aid in improving the deposition rate at low temperatures tending to enhance the selective of W° deposition on Si° verses $SiO_2$.

There are disadvantages in using silanes for $WF_6$ reduction and some of these disadvantages are: Silane and polysilanes are toxic (i.e. TWA of silane is 5 ppm) and pyrophoric materials and hence dangerous and expensive to handle. There have been several fatal explosions related to silane use in the electronics industry. In addition, the amount of silane used in the reactions as well as the deposition temperature must be carefully controlled to limit the amount of silicon incorporation into the films. Silicon incorporation in the film results in a higher electrical resistivity relative to the pure tungsten metal (Ohba, T. et al, *Tungsten and Other Refractory Metals for ULSI Applications Vol. IV* p. 17 and U.S. Pat. Nos. 4,851,295 and 4,892,893.) Apparently because of silicon incorporation resistivity values for silane deposited films in general are greater than those for hydrogen reduced $WF_6$ films.

The mechanism of $WF_6$ reduction by silane described by M. L. Yu, and B. N. Eldrige, in *J. Vac. Sci. Technol.* A7, 625, 1989 comprises alternating deposition of tungsten and then silicon. The removal of silicon is accomplished by the reaction with $WF_6$ to deposit tungsten according to equation 1. The deposition of tungsten and silicon followed by the removal of silicon results in the deposition of tungsten film with silicon impurity. Silane is known to deposit silicon under appropriate conditions but the feed material for depositing such films are generally thought to be restricted to silicon compounds with readily removable groups.

Herd S. R. et al in the *Proceedings of the 1989 workshop on Tungsten and other Refractory Metals*, Materials Research Society, Pittsburgh, Pa. 48–53 (1989) reported the reduction of $WF_6$ using dichlorosilane $H_2SiCl_2$ as a reductant. The authors concluded that the rate of tungsten deposition in this case was significantly lower relative to that of the simple $H_2$ reduction carried out under similar conditions. The resistivities of the films were also higher than those obtained by hydrogen reduction i.e. 68 $\mu\Omega$-cm vs 13 $\mu\Omega$-cm. This would suggest that even a simple modification of the silane and polysilane reductant has a deleterious effect on the film quality.

S. Nishikawa et al *J. Appl. Phys.* p774–777, 67, 1990 describe the reduction of $WF_6$ to tungsten films using mixtures of $H_2$ and hexafluorodisilane, $Si_2F_6$. The maximum rate enhancement was only twice that of the pure hydrogen reduction and the resistivity of the films was very sensitive to the ratio of $Si_2F_6$ to $WF_6$. Above a 0.5:1 molar mixture of $Si_2F_6:WF_6$ there were large increases in film resistivity from their minimum values of approximately 10 $\mu\Omega$-cm, presumably related to silicon incorporation into the film. Finally, $Si_2F_6$ is a toxic, highly corrosive, and water reactive gas which requires special handling.

The presumptions in the literature relating to the mechanism for the reduction of $WF_6$ by silane and polysilane along with examples of carbon incorporation in films deposited using organosilane precursors would lead to the conclusion that the groups bound to the silicon must be easily removed (i.e., the hydride ligand in silane), and that difficult to remove groups such as carbon containing organic moieties i.e. methyl, ethyl substituted silanes would result in the incorporation of carbon in the films. H. Du, et al in the *Chemistry of Materials* p 569–571, 1, 1989 describe heavy carbon contamination of silicon nitride films prepared by CVD reactions of amino organohydrosilanes.

R. G. Gordon et al *Chem. of Materials* p 480–482, 2 1990 describe carbon incorporation in silicon nitride films from organoaminosilanes and similar findings of carbon incorporation have been associated with depositions of polysilicon and silicon carbide.

Although the methods described above and illustrated by equations 1 to 4 have been useful in depositing thin tungsten films on ceramic and metallic substrates, no one has yet disclosed a fully satisfactory method of depositing thin tungsten films at good deposition rates and at low temperatures without undercutting the masked areas, eroding the substrate, or using toxic or pyrophoric materials. As reported in some of the references previously cited films deposited from silane enhanced reduction show higher resistivities than $6.0 \times 10^{-6}$ ohm-cm which is reported as typical for hydrogen reduced $WF_6$ films. The deposition of thin tungsten films at low temperatures without eroding the substrate, undercutting the masked areas, and with using non-toxic and non-pyrophoric materials would be useful to the electronics industry in terms of increasing overall productivity and efficiency by reducing wastage.

SUMMARY OF THE INVENTION

The present invention is a method of depositing substantially pure thin tungsten films on metallic and ceramic substrates by using novel reducing agents. According to the method, the thin and substantially pure tungsten films are chemical vapor deposited on ceramic and metallic substrates under subatmospheric pressure to slightly atmospheric, i.e., within the range of 0.05 torr to about. 1,000 torr, at a temperature of about 200° C. to about 450° C. using a mixture of process gases comprising tungsten hexafluoride, hydrogen, and an organohydrosilane.

According to the present invention thin tungsten films with columnar and non-columnar, fine-grained microstructures can be deposited using a wide range of process conditions and a variety of organohydrosilane compounds. More specifically, by conjunctively controlling various interdependent operating parameters, especially the reaction temperature within the range of about 200° to about 450° C., the feed ratio of organohydrosilane compound to tungsten hexafluoride compound within the range from about 0.5 to about 1.5, the feed ratio of hydrogen to tungsten hexafluoride within the range from about 4 to about 1,000, and the nature of the organohydrosilane compound, it is possible to deposit thin tungsten films with columnar or non-columnar, fine-grained microstructures at low temperatures and high deposition rates. Contrary to normal expections these tungsten films have been found to be substantially free from impurities such as silicon and carbon. An additional unexpected finding is the deposited films have very low electrical resistance, a key advantage for one of their intended applications for electrical interconnection in an integrated circuit.

According to the invention described herein, tungsten films are produced by the CVD process using a reaction mixture of $WF_6$, $H_2$ and organohydrosilane of the general formula.

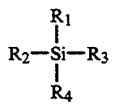

Wherein: $R_1$, $R_2$, $R_3$, and $R_4$ are independently selected from the group comprising hydrogen a $C_1$–$C_{10}$ alkyl group, a $C_6$–$C_{10}$ aryl, a $C_6$–$C_{10}$ aralkyl, an organosilyl radical of the type

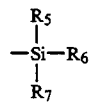

where $R_5$, $R_6$, and $R_7$ are selected from the group $C_1$ to $C_{10}$ alkyl or hydrogen or mixtures thereof with at least one but not all of $R_1$, $R_2$, $R_3$, and $R_4$ being hydrogen.

DETAILED DESCRIPTION OF THE INVENTION

The present invention discloses the deposition of thin tungsten films with low electrical resistance by conventional chemical vapor deposition techniques. The method of the present invention is based on the surprising discovery that thin tungsten films with columnar and non-columnar, fine-grained microstructures free from silicon and carbon impurities can be deposited by carefully selecting the deposition temperature, organohydrosilane compound, and the ratios of organohydrosilane to $WF_6$ and hydrogen to $WF_6$.

Turning now to preferred process conditions for depositing thin tungsten films, with regard to reaction temperature, temperatures in the range of about 200° C. to about 450° C. can be employed in a process, with temperatures in the range of about 220° C. to about 380° C. being preferred.

With regard to reaction pressure, pressures of about 0.05 torr to about 1,000 torr can be used; pressures in the range of about 0.5 torr to 800 torr are preferred.

With regard to the hydrogen gas component of the reaction mixture, a ratio of hydrogen to $WF_6$ of about 4 to about 1,000 can be used; it is preferred to use a ratio of about 10 to 500.

With regard to organohydrosilane compound, compounds having the general formula:

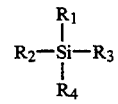

wherein: $R_1$, $R_2$, $R_3$ and $R_4$ are selected from the group comprising of hydrogen, a $C_1$ to $C_{10}$ alkyl group, a $C_6$ to $C_{10}$ aryl group, a $C_6$ to $C_{10}$ aralkyl group, an organosilyl radical of the type:

wherein: $R_5$, $R_6$ and $R_7$ are selected from the group $C_1$ to $C_{10}$ alkyl or hydrogen or mixtures thereof with at least one but not all of R groups being hydrogen can be used. Preferred compounds are diethylsilane, dimethylethylsilane, and n-butylsilane.

Due to the interdependency of the various operating parameter, it is to be expected that the operating range of the organohydrosilane to $WF_6$ ratio may change depending on the number of silicon atoms in the organohydrosilane compound. For example, use of a compound with one silicon atom would require a ratio from about 0.5 to about 1.5. On the other hand, use of a compound with two or more silicon atoms would be expected to require much lower range of ratio.

The thin tungsten films of the present invention can be deposited in a conventional CVD reactor, a low pressure CVD reactor, or a plasma assisted CVD reactor. The plasma can be generated by direct current discharge (DC Plasma), radio frequency ( RF plasma), or microwave (MW plasma).

The thin tungsten films of the present invention have been deposited on silicon and silicon oxide. One should be able to deposit these films on a number of ceramic and metallic substrates such as gallium-arsenide, silicon carbide, silicon nitride, titanium nitride, boron nitride, single crystal diamond, polycrystalline diamond film, metallic substrates such as aluminum, copper, titanium, silver, gold, platinum, cobalt, rhodium, rhenium, and tantalum, and metal silicides of tungsten, titanium, platinum, and cobalt.

An inert carrier gas such as nitrogen, argon, helium, xenon, and krypton can optionally be used during the deposition of the thin tungsten films of the present invention.

Using the preferred organohydrosilane compounds such as diethylsilane, dimethylethylsilane, and n-butylsilane, the examples described below illustrate deposition of thin tungsten films of the present invention. The examples are for illustrative purposes only and are not meant to limit the scope of the claims in any way.

Table 1 sets forth the results of five examples of deposition of tungsten films according to the invention.

TABLE 1

|  | Ex 1 | Ex 2 | Ex 3 | Ex 4 | Ex 5 |
|---|---|---|---|---|---|
| Run# | 682 | 681 | 680 | 668 | 667 |
| Temperature, °C. | 230 | 230 | 250 | 325 | 325 |
| Total Pressure, Torr | 40 | 40 | 40 | 40 | 40 |
| Flow Rate of Gases, sccm | | | | | |
| $WF_6$ | 25 | 25 | 25 | 150 | 150 |
| $H_2$ | 300 | 300 | 300 | 2,000 | 300 |
| DES | 0 | 20 | 25 | 150 | 150 |
| Ar | 9,000 | 9,000 | 9,000 | 8,000 | 10,000 |
| Deposition Time, Min | 15 | 15 | 15 | 60 | 60 |
| W Film Thickness, Å | <150 | 340 | 950 | >2,000 | 2,500 |
| Film Resistance, ohm, —cm | 0.0003 | — | — | 0.000006 | 0.000006 |

Example 1

This example describes the deposition of W by hydrogen reduction of $WF_6$. A silicon (100) wafer was placed in an inductively heated graphite reactor inside a gas-tight quartz envelope. The wafer was pre-etched with dilute hydrofluoric acid to remove the thin oxide layer from the surface. The wafer was heated to 230° C. in the presence of a flowing mixture of hydrogen and argon. At the temperature of 230° C. the gaseous mixture of 25 cc/min of $WF_6$, 300 cc/min of $H_2$, and 9,000 cc/min of argon was passed into the reactor for 15 minutes to deposit tungsten, as shown in Table 1. A total pressure of 40 torr was maintained during the preheating and the deposition steps. After the deposition time of 15 minutes, the flow of the reactive gases was stopped and the coated wafer was cooled in flowing argon. The wafer had a very thin film of tungsten (<150 Å) deposited on its surface, which was confirmed by Auger analysis. The electrical resistivity of CVD W determined by four-point probe technique was 0.0003 ohm-cm. This example demonstrates that a thin tungsten film with high electrical resistance can be deposited by hydrogen reduction of $WF_6$ at 230° C.

Example 2

This example describes the deposition of tungsten by reduction of $WF_6$ with a mixture of hydrogen and diethylsilane (DES). A silicon wafer was placed in the reactor described in Example 1 and heated to 230° C. under a flowing mixture of $H_2$ and argon. Tungsten was deposited using 25 cc/min of $WF_6$, 300 cc/min of H2, 20 cc/min of DES, and 9,000 cc/min of argon as shown in Table 1.

A thick layer of tungsten (340 Å) was deposited on the wafer, showing that a relatively thick layer of tungsten can be deposited at 230° C. by the reduction of $WF_6$ with a mixture $H_2$ and diethylsilane(DES). The improvement in deposition rate obtained by the addition of DES over a straight hydrogen reduction of $WF_6$ has been clearly demonstrated by this example.

Example 3

The deposition of tungsten described in Example 2 was repeated using a deposition temperature of 250° C. and a flow rate of 25 cc/min of DES. The deposition conditions are summarized in detail in Table 1. A 950 Å thick tungsten film was deposited on the wafer, showing that thicker films of tungsten can be deposited at 250° C. by reduction of $WF_6$ with $H_2$ and DES.

Example 4

This example describes the deposition of tungsten by reduction of $WF_6$ with a mixture of $H_2$ and DES. A silicon (100) wafer pre-etched with dilute HF acid was placed in the reactor and heated to 325° C. in the presence of a mixture of hydrogen and argon described in Example 1. At the temperature of 325° C. a gaseous mixture of 150 cc/min of $WF_6$, 2,000 cc/min $H_2$, 150 cc/min of DES, and 8,000 cc/min of argon was passed into the reactor at 40 torr for 60 minutes to deposit a tungsten film (see Table 1). After the deposition time of 60 minutes, the flow of reactive gases was stopped and the coated wafer was cooled in flowing argon gas. The wafer was deposited with a thick tungsten film, as shown in Table 1 having a fairly low electrical resistivity, demonstrating that a low-resistivity tungsten film can be deposited at a high rate by reducing $WF_6$ with a mixture of $H_2$ and DES.

Example 5

The tungsten deposition experiment described in Example 4 was repeated using a similar reactor and conditions except for using 300 cc/min of $H_2$ and 10,000 cc/min of argon. The wafer was deposited with a thick tungsten film, as shown in Table 1 exhibiting a columnar microstructure similar to the one shown in the photomicrograph of FIG. 1. The film had fairly low electrical resistivity, indicating a low-resistivity tungsten film can be deposited at high rate by reducing $WF_6$ with a mixture of $H_2$ and DES.

Table 2 details the results of Examples 6 and 7 discussed below:

TABLE 2

|  | Ex 6 | Ex 7 |
| --- | --- | --- |
| Run# | A | B |
| Temperature, °C. | 325 | 325 |
| Total Pressure, Torr | 40 | 40 |
| Flow Rate of Gases, sccm | | |
| $WF_6$ | 150 | 150 |
| $H_2$ | 2,000 | 2,000 |
| Ar | 8,000 | 8,000 |
| n-butylsilane | 150 | — |
| Dimethylethylsilane | — | 150 |
| Deposition time, Min. | 60 | 60 |
| W Film Thickness, Å | >3,000 | >3,000 |

Example 6

This example describes the deposition of tungsten by reduction of $WF_6$ with mixture of $H_2$ and n-butylsilane. A silicon (100) wafer pre-etched with dilute HF acid was placed in the reactor described in Example 1 and heated to 325° in the presence of a mixture of hydrogen and argon. At the temperature of 325° C. a gaseous mixture of 150 cc/min of $WF_6$, 2,000 cc/min of $H_2$, 150 cc/min of n-butylsilane, and 8,000 cc/min of argon was passed into the reactor at 40 torr for 60 minutes to deposit tungsten as shown in Table 2. After a deposition time of 60 minutes, the flow of reactive gasses was stopped and the coated wafer was cooled in the flowing argon gas.

As shown in Table 2 the wafer was deposited with a thick tungsten film. The AES analysis of the film showed it to contain primarily tungsten free of silicon, carbon and oxygen impurities. This example showed that a thick tungsten film can be deposited by the reduction of $WF_6$ with $H_2$ and n-butylsilane.

Example 7

The tungsten deposition experiment described in Example 6 was repeated using a similar reactor and reaction conditions except for using 150 cc/min of dimethylethylsilane as the silicon source. As shown in Table 2 a thick tungsten film was deposited on the wafer. The film contained no silicon or carbon, as determined by AES and exhibited a non columnar, fine-grained. This example showed that a thick tungsten film can be deposited at high rate by reducing $WF_6$ with a mixture of $H_2$ and dimethylethylsilane.

The foregoing examples demonstrate that tungsten films with columnar and non-columnar, fine-grained microstructures can be deposited by reducing $WF_6$ with a mixture of hydrogen and an organohydrosilane compound. They also show that tungsten films with considerably higher deposition rates can be deposited by reducing $WF_6$ with a mixture of $H_2$ and an organohydrosilane compound. This is an unexpected result.

The deposition of tungsten films by the reduction of $WF_6$ with a mixture of hydrogen and silane ($SiH_4$) has been known to result in the formation of $SiF_4$ and in most cases incorporation of silicon into the films. The incorporation of silicon into the films is known to increase the electrical resistance of the films which is not desirable for VLSI related applications. Previously cited references in the literature suggest that carbon incorporation might be associated with the use of an organohydrosilane as a reducing agent. In addition the proposed mechanism for of WF$_6$ reduction with silane, films would also lead one to expect films to contain deleterious carbon and silicon impurities. The incorporation of silicon and carbon in the films increases their electrical resistance rendering them less desirable to the electronics industry. However, the use of organohydrosilane for reducing WF$_6$ unexpectedly results in the deposition of tungsten films with substantially no incorporation of silicon or carbon, and also with films with low electrical resistance. Hence, the generation of these high quality tungsten films was an unexpected result.

The reduction of WF$_6$ with a mixture of H$_2$ and silane, as mentioned earlier, is under active development for use in the commercial scale fabrication of integrated circuits. The use of silane, however, has been considered to be undesirable because of its inherent toxicity and explosive nature. On the other hand, organohydrosilanes are neither toxic nor explosive in nature relative to silane as described by B. Arkles and W. R. Peterson, Jr. in Kirk-Othmer Encyclopedia of Chemical Technology, 3rd edition, Vol. 20, p. 887–911, which is incorporated herein by reference. Therefore, the use of organohydrosilanes for depositing tungsten films overcome all the material related problems. Overall, the advantages of using organohydrosilanes for depositing tungsten films by reducing WF$_6$ over the prior art can be summarized as follows:

- The organohydrosilanes disclosed herein are stable in air and have lower toxicity than the pyrophoric, toxic silane and polysilanes used in the prior art.
- The organohydrosilanes disclosed herein provide considerably higher deposition rates than those observed with simple reduction of WF$_6$ with H$_2$ under the same deposition conditions.
- The use of organohydrosilanes described herein result in the deposition of tungsten films with columnar and non-columnar, fine-grained microstructures. Additionally, they facilitate the deposition of tungsten films with substantially no incorporation of silicon and carbon.
- The use of organohydrosilanes disclosed herein facilitate the deposition of tungsten films with extremely low electrical resistance.

What is desired to be secured by Letters Patent of the United States is set forth in the appended claims.

We claim:

1. The method of depositing a tungsten film comprising the steps of:
   heating a substrate to a temperature above 200° C. under subatmospheric to atmospheric pressure in a chemical vapor deposition reactor;
   and following stream of hydrogen gas over the substrate in the reactor; and simultaneously introducing into said reactor mixtures of WF$_6$ and n organohydrosilane having the general formula:

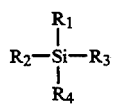

wherein: R$_1$, R$_2$, R$_3$, and R$_4$ are selected from the group comprising hydrogen, a C$_1$ to C$_{10}$ alkyl group, a C$_6$ to C$_{10}$ aryl or aralkyl, or mixtures thereof with at least one but not all of the R groups being H.

2. The method of claim 1 wherein the organohydrosilane moieties R$_1$, R$_2$, R$_3$, and R$_4$ would also include the organosilyl radical, of the type:

wherein: R$_5$, R$_6$, and R$_7$ are selected from the group comprising of hydrogen, C$_1$–C$_{10}$ alkyl, or mixtures thereof.

3. The method of claim 1 wherein the deposition temperature is between 200° C. to about 450° C.

4. The method of claim 3 wherein the deposition temperature is between 220° C. and 380° C.

5. The method of claim 3 wherein the deposition temperature is between 200° C. and 360° C.

6. The method of claim 1 wherein the reactor pressure in the reactor is selected from about 0.05 to 1000 torr.

7. The method of claim 1 wherein the organohydrosilane to WF$_6$ ratio is less than 1.5.

8. The method of claim 1 wherein the organohydrosilane is a dialkylsilane of the type:

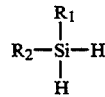

wherein: R$_1$ and R$_2$ are selected from the group comprising a C$_1$ to C$_6$ alkyl group.

9. The method of claim 8 wherein the organohydrosilane is diethylsilane.

10. The method of claim 8 wherein the organohydrosilane is dimethylsilane.

11. The method of claim 1 wherein the organohydrosilane is a monoalkylsilane of the type:

wherein: R is selected from the group comprising a C$_1$ to C$_{10}$ alkyl, a C$_{6-}$C$_{10}$ aryl, or aralkyl group.

12. The method of claim 11 wherein the organohydrosilane is methylsilane.

13. The method of claim 11 wherein the organohydrosilane is butylsilane.

14. The method of claim 1 wherein the organohydrosilane is a trialkylsilane of the type:

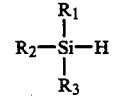

wherein: R$_1$, R$_2$, and R$_3$ are selected from the group comprising a C$_1$ to C$_6$ alkyl.

15. The method of claim 14 wherein the organohydrosilane is dimethylethylsilane.

16. The method of claim 1 wherein the organohydrosilane is diethylsilane and the substrate temperature is 325° C., whereby the as deposited tungsten film exhibits a columnar growth microstructure.

17. The method of claim 1 wherein the organohydrosilane is dimethylethylsilane, the substrate temperature is 325° C., and argon is mixed with said hydrogen, whereby the as deposited tungsten film exhibits a non-columnar, fine-grained growth microstructure.

* * * * *

UNITED STATES PATENT AND TRADEMARK OFFICE
CERTIFICATE OF CORRECTION

PATENT NO. : 5,433,975
DATED : Jul. 18, 1995
INVENTOR(S) : Roberts, et al.

It is certified that error appears in the above-indentified patent and that said Letters Patent is hereby corrected as shown below:

<u>IN THE CLAIMS</u>:

Column 9, line 55, delete "following" and insert -- flowing a --.

Column 9, line 57, delete "n" and insert -- an --.

Signed and Sealed this

Nineteenth Day of September, 1995

*Attest:*

BRUCE LEHMAN

*Attesting Officer*  *Commissioner of Patents and Trademarks*